(12) United States Patent
Wang et al.

(10) Patent No.: US 11,114,640 B2
(45) Date of Patent: Sep. 7, 2021

(54) DISPLAY SUBSTRATE AND METHOD FOR MANUFACTURING THE SAME, AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Lina Wang, Beijing (CN); Fuyi Cui, Beijing (CN); Shuai Chen, Beijing (CN); Zifeng Wang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 330 days.

(21) Appl. No.: 16/088,126

(22) PCT Filed: Jan. 22, 2018

(86) PCT No.: PCT/CN2018/073566
§ 371 (c)(1),
(2) Date: Sep. 25, 2018

(87) PCT Pub. No.: WO2019/000923
PCT Pub. Date: Jan. 3, 2019

(65) Prior Publication Data
US 2020/0303672 A1    Sep. 24, 2020

(30) Foreign Application Priority Data
Jun. 30, 2017    (CN) .......................... 201710523646.1

(51) Int. Cl.
*H01L 51/52*    (2006.01)

(52) U.S. Cl.
CPC ........ *H01L 51/525* (2013.01); *H01L 51/5246* (2013.01)

(58) Field of Classification Search
CPC ... H01L 51/525; H01L 51/5246; H01L 51/56; H01L 51/524
See application file for complete search history.

(56) References Cited

U.S. PATENT DOCUMENTS

| 2016/0266435 A1 | 9/2016 | Xiao et al. |
| 2016/0329528 A1 | 11/2016 | Sun |

(Continued)

FOREIGN PATENT DOCUMENTS

| CN | 103969883 A | 8/2014 |
| CN | 104409662 A | 3/2015 |

(Continued)

OTHER PUBLICATIONS

Search Report and Written Opinion for International Application No. PCT/CN2018/073566 dated May 2, 2018.

(Continued)

*Primary Examiner* — Anthony Ho
(74) *Attorney, Agent, or Firm* — Calfee, Halter & Griswold LLP

(57) ABSTRACT

The present disclosure provides a display substrate and a method for manufacturing the same, and a display device. The display substrate includes a display area and an edge area surrounding the display area. The edge area is provided with bonding adhesive. The bonding adhesive is used to bond the display substrate and a counter substrate with which the display substrate is to be assembled together. A support structure is provided on the edge area and on a side of the bonding adhesive away from the display area. The (Continued)

support structure forms support between the display substrate and the counter substrate which have been assembled with each other.

13 Claims, 2 Drawing Sheets

(56) References Cited

U.S. PATENT DOCUMENTS

| | | |
|---|---|---|
| 2017/0062759 A1 | 3/2017 | Gai et al. |
| 2017/0278897 A1 | 9/2017 | Ao et al. |
| 2017/0282495 A1 | 10/2017 | Zhang et al. |
| 2018/0102504 A1 | 4/2018 | Liu |

FOREIGN PATENT DOCUMENTS

| | | |
|---|---|---|
| CN | 104635385 A | 5/2015 |
| CN | 105097885 A | 11/2015 |
| CN | 105226202 A | 1/2016 |
| CN | 105629593 A | 6/2016 |
| CN | 105810849 A | 7/2016 |
| CN | 106549116 A | 3/2017 |
| CN | 107275517 A | 10/2017 |

OTHER PUBLICATIONS

First Office Action for Chinese Patent Application No. 201710523646.1 dated Jun. 20, 2018.
Second Office Action for Chinese Patent Application No. 201710523646.1 dated Dec. 11, 2018.
Decision of Rejection for Chinese Patent Application No. 201710523646.1 dated Jan. 30, 2019.

DISPLAY SUBSTRATE AND METHOD FOR MANUFACTURING THE SAME, AND DISPLAY DEVICE

CROSS REFERENCE TO RELATED APPLICATIONS

The present application is a 35 U.S.C. § 371 national stage application of PCT International Application No. PCT/CN2018/073566, filed on Jan. 22, 2018, which claims the priority of Chinese patent application No. 201710523646.1, filed on Jun. 30, 2017, the content of which are incorporated herein by reference in their entireties.

TECHNICAL FIELD

The present disclosure relates to the field of display technology, and particularly to a display substrate and a preparation method thereof, and to a display device.

BACKGROUND

Currently, OLED display devices normally use glass cement for edge packaging. Glass cement belongs to rigid material. A packaging with glass cement using laser may cause a variety of problems.

SUMMARY

According to an aspect of the present disclosure, there is provided a display substrate, comprising a display area and an edge area surrounding the display area. The display substrate comprises bonding adhesive at the edge area. The bonding adhesive is configured to bond the display substrate and a counter substrate with which the display substrate is to be assembled. The display substrate further comprises a support structure on the edge area and on a side of the bonding adhesive away from the display area. The support structure is configured to form support between the display substrate and the counter substrate which have been assembled with each other.

In an embodiment, a gap exists between the support structure and the bonding adhesive.

In an embodiment, a width of the gap is substantially equal to 30~50 μm.

In an embodiment, a height of the support structure is less than a height of the bonding adhesive before the display substrate and the counter substrate are bonded.

In an embodiment, the bonding adhesive comprises glass cement.

In an embodiment, the display area is further provided with a spacer.

In an embodiment, a material of the support structure is the same as a material of the spacer.

In an embodiment, a height of the support structure is the same as a height of the spacer.

In an embodiment, the display substrate comprises a plurality of the support structures spaced from each other.

In an embodiment, a spacing between two adjacent ones of the support structures is substantially equal to 5~10 μm.

In an embodiment, a shape of a cross section of the support structure perpendicular to an extending direction of the display substrate on which the support structure is located is trapezoid. A bottom surface of the support structure having a larger area is in contact with the display substrate.

In an embodiment, a shape of a cross section of the support structure perpendicular to an extending direction of the display substrate on which the support structure is located is rectangle.

In an embodiment, the counter substrate is an array substrate.

In an embodiment, the display substrate is a packaging cover plate or a color film substrate.

According to another aspect of the present disclosure, there is provided a display device, comprising a display substrate according to any one of the above embodiments.

According to a further aspect of the disclosure, there is provided a method for manufacturing a display substrate, which comprises a display area and an edge area. The method comprises:
  coating the edge area with bonding adhesive,
  providing a support structure on the edge area and on a side of the bonding adhesive away from the display area, and
  sintering the bonding adhesive.

It should be understood that unless explicitly stated to the contrary, in any of the methods described by the present disclosure which comprise more than one step or action, the order of these steps or actions is not necessarily limited to the described order.

BRIEF DESCRIPTION OF THE DRAWINGS

These and other aspects of the disclosure will be apparent from the embodiments described below and be further elucidated by way of example with reference to the accompanying drawings, in the drawings.

DETAILED DESCRIPTION

The inventors have found that, after employing a laser to package glass cement, stress exist in the packaging area. The glass substrate itself may have deformation. The thinner the glass substrate is, the larger the degree of deformation. When cutting the edge of the OLED display device, the cut glass cement has the possibility of micro-cracking, which directly affects the packaging performance of the OLED display device. Micro-cracking may be due to the deformation of the glass substrate, the rigidity of the glass cement and the stress in the packaging area.

The inventors have also found that the height and homogeneity of the glass cement are changed after laser sintering. This easily causes Newton's ring on the bonding surface between the glass cement and the glass substrate as well as the film surface of the display area of the OLED display device. This affects not only the packaging effect of glass cement, but also the display effect of the display area.

Therefore, how to avoid the occurrence of the above-described undesirable phenomena when cutting the OLED display device edges which employ glass cement for packaging edge has become a technical problem to be solved urgently.

Figure 1:
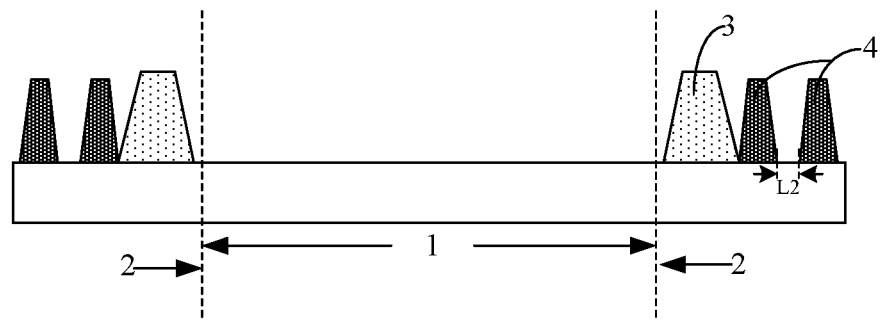
FIG. 1 is a schematic sectional view of the structure of a display substrate according to an embodiment of the present disclosure.

According to an aspect of the present disclosure, there is provided a display substrate. As shown in FIG. 1, the display substrate includes a display area 1 and an edge area 2 surrounding the display area 1. The display substrate includes bonding adhesive 3 located at the edge area 2. The bonding adhesive 3 is configured to bond the display substrate and a counter substrate with which the display substrate is to be assembled. The display substrate also includes a support structure 4 located on the edge area 2 and on a side of the bonding adhesive 3 away from the display area 1. The support structure 4 is configured to form support between the display substrate and the counter substrate which have been assembled with each other.

By providing the support structure 4 on the edge area 2 and on a side of the bonding adhesive 3 away from the display area 1, support may be formed between the display substrate and the counter substrate which have been assembled with each other. When cutting the assembled display substrate and counter substrate in the edge, the cutting line (i.e. the path of a cutting tool when conducting cutting) is normally perpendicular to the display substrate and located on a side of the bonding adhesive 3 away from the display area 1 or located on the bonding adhesive 3. The provision of the support structure 4 can prevent the bonding adhesive 3 from being cracked when performing edge cutting, thereby ensuring the bonding performance of the bonding adhesive 3. Further, the bonding adhesive 3 may be melted into a liquid state in the bonding process. The support structure 4 can effectively control the morphology of the liquid-state bonding adhesive 3 when the bonding adhesive 3 bonds, so that the liquid-state bonding adhesive 3 will not overflow beyond the support structure 4 and thereby respectively maintaining the consistencies of the height and the homogeneity of the cured bonding adhesive 3, thereby avoiding the Newton's ring on the bonding surface between the bonding adhesive 3 and the counter substrate as well as the film surface of the assembled display substrate and counter substrate in the display area 1, and finally ensuring the packaging effect of the bonding adhesive 3 and the display effect of the display area 1.

Figure 2:
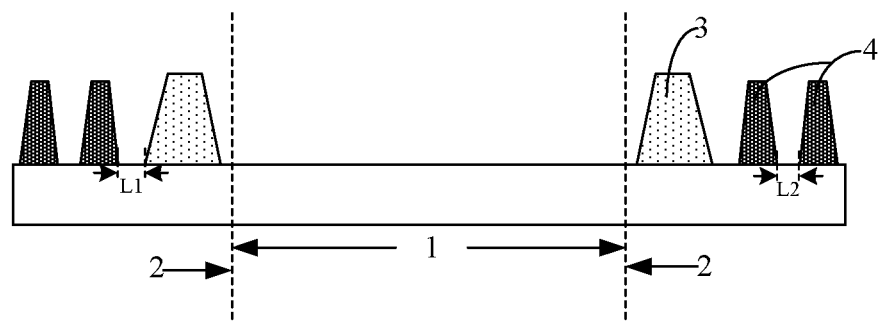
FIG. 2 is a schematic sectional view of the gap between the support structure and the bonding adhesive of the display substrate according to an embodiment of the present disclosure.

In an embodiment, the support structure 4 and the bonding adhesive 3 are in contact with each other, as shown in FIG. 1. In another embodiment, a gap L1 may also exist between the support structure 4 and the bonding adhesive 3, as shown in FIG. 2. In both cases, the support structure 4 can support the assembled display substrate and counter substrate. This avoids the occurrence of cracking on the bonding adhesive 3 caused by the cutting and at the same time avoids the occurrence of Newton' ring after bonding.

Figure 3:
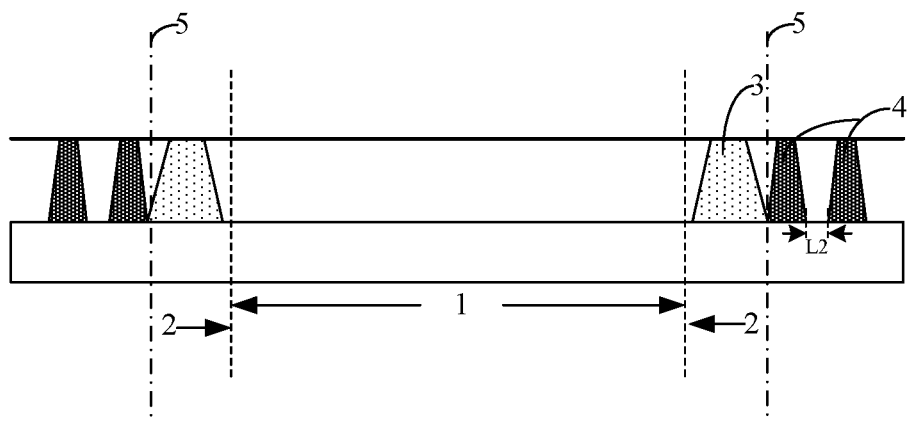
FIG. 3 is a schematic sectional view of a narrow-edge cutting of the display substrate of FIG. 1.
Figure 4:
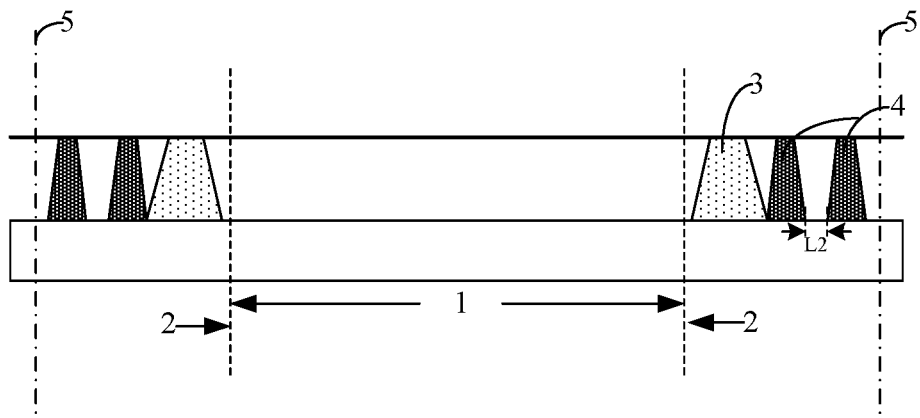
FIG. 4 is a schematic sectional view of a wide-edge cutting of the display substrate of FIG. 1.
Figure 5:
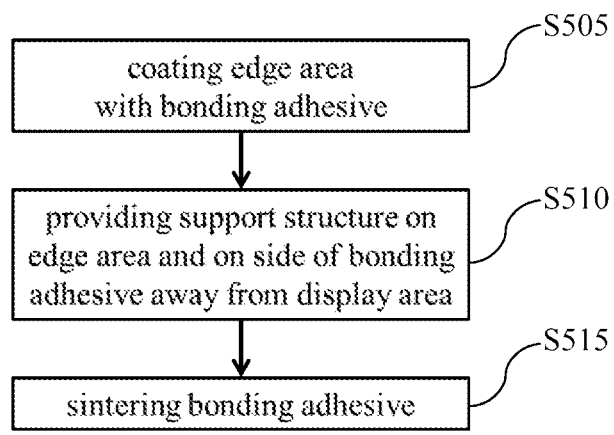
FIG. 5 is a flowchart of a method for manufacturing a display substrates according to the present disclosure.

FIG. 3 shows a situation in which a narrow-edge cutting is done to the display substrate. As shown in FIG. 3, the cutting line 5 is at a side of the support structure 4 close to the bonding adhesive 3 or on the bonding adhesive 3, and only the bonding adhesive 3 in its entirety or only a part of the bonding adhesive 3 is left after the edge cutting, with the support structure 4 being cut out. FIG. 4 shows a situation in which a wide-edge cutting is done to the display substrate. As shown in FIG. 4, the cutting line 5 is located at a side of the support structure 4 away from the bonding adhesive 3, and both the bonding adhesive 3 and the support structure 4 are retained after the edge cutting. Whether in the situation of narrow-edge cutting of FIG. 3 or in the situation of wide-edge cutting of FIG. 4, the support structure 4 can form support between the assembled display substrate and counter substrate to avoid the occurrence of cracking on the bonding adhesive 3 caused by the cutting.

In an embodiment, the width of the gap L1 formed between the support structure 4 and the bonding adhesive 3 is substantially in the range of 30 to 50 μm. In the above range, the support structure 4 can form good support between the display substrate and the counter substrate, when the edge cutting is done to the assembled display substrate and the counter substrate to avoid the occurrence of cracking on bonding adhesive 3.

In an embodiment, the height of the support structure 4 is less than the height of the bonding adhesive 3 before bonding the display substrate and the counter substrate. Since the bonding adhesive 3 may be melt into a liquid state in the bonding process, the height of the bonding adhesive 3 may be reduced in the bonding process. This causes the bonding adhesive 3 to well bond the display substrate and the counter substrate with the auxiliary support effect of the support structure 4. Further, this ensures that no gap is formed between the display substrate and the bonding adhesive 3 as well as between the counter substrate and the bonding adhesive 3, after the bonding adhesive 3 is cured.

In an embodiment, the display area 1 is also provided with a spacer. The support structure 4 is of the same material as the spacer. Since the spacer is normally made of a material having certain degree of elasticity, the spacer can work to support on the one hand and avoid causing excessive support force on the two substrates it supports during the support process, to avoid breaking the two substrates. The support structure 4, whose material is the same as the spacer, can also have the above effects, i.e., ensuring good support effect and avoiding break the two assembled substrates during the edge cutting process.

It should be noted that during the manufacturing of the support structure 4, spacer is formed at the same time. The manufacturing method is simple and will not provide any additional manufacturing process of the display substrate.

In an embodiment, the support structure 4 is of the same height as the spacer. This can ensure that the cell gaps of the display area 1 and the edge area 2 has no difference, thereby avoiding the occurrence of Newton' ring on the bonding surface between the bonding adhesive 3 and the counter substrate as well as the film surface of the assembled display substrate and counter substrate in the display area 1, and finally ensuring the packaging effect of the bonding adhesive 3 and the display effect of the display area 1.

In an embodiment, the display substrate includes a plurality of support structures 4 spaced from each another. In an exemplary embodiment, the quantity of the support structures 4 is two. The two support structures 4 can share the cutting stress at the time of edge cutting, thereby further ensuring good support for the display substrate and the counter substrate. This avoids a single support structure 4 that cannot withstand the cutting stress, thereby forming good support for the two substrates during the edge cutting, and ensuring the packaging effect of the bonding adhesive 3.

In an embodiment, the spacing L2 between two adjacent support structures 4 is substantially in the range of 5 to 10 μm. The spacing L2 in this range enables the plurality of support structures 4 to well share the cutting stress, avoiding damage to any one of the support structures 4. At the same time, it also avoids the occurrence of cracking in the bonding adhesive 3 to ensure the cutting effect of the edge and the packaging effect of the bonding adhesive 3.

In an embodiment, the shape of the cross section of the support structure 4, which is perpendicular to the extending direction of the display substrate that the support structure is located at, is a trapezoid. The bottom surface of the trapezoid support structure 4, having a larger area, is in contact with the display substrate. This can ensure that the support structure 4 is firmly disposed on the display substrate, thereby ensureing that the support structure 4 supports the display substrate and the counter substrate more firmly.

It should be noted that the shape of the above cross section of the support structure 4 may also be other shapes, such as rectangle.

In an embodiment, the bonding adhesive 3 is glass cement. The glass cement is relatively brittle and is easily cracked during edge cutting. The provision of the support structure 4 carries the cutting stress, and thereby can avoiding the occurrence of cracking on the glass cement during edge cutting.

In an embodiment, the counter substrate is an array substrate, and the display substrate is a packaging cover plate. In an exemplary embodiment, the array substrate is an OLED substrate, and the display substrate is a packaging cover plate that packages the OLED device on the OLED substrate. In the OLED display panel, the edge adhesive normally employs glass cement which is relatively brittle. The support structure 4 can avoid the occurrence of cracking on the glass cement when the OLED display panel is subject to the edge cutting, ensuring the packaging quality of the OLED display panel.

It should be noted that the display substrate may also be a color film substrate, and the counter substrate may also be an LCD substrate. The color film substrate and the LCD substrate are assembled to form an LCD display panel. In the edge cutting of the LCD display panel, the support structure 4 can also function to prevent the edge adhesive from being broke or damaged during the cutting process.

The present disclosure further provides a method for manufacturing a display substrate. The display substrate includes a display area and an edge area. The method comprises:

S505: coating the edge area with bonding adhesive,

S510: providing a support structure on the edge area and on a side of the bonding adhesive away from the display area, and S515: sintering the bonding adhesive.

The bonding adhesive placed at the edge area is sintered by laser. The support structure is formed by using a conventional film patterning process including the steps of film coating, exposure, development, and the like, which will not be repeated herein.

When the display substrate and the counter substrate are bonding, the bonding adhesive is melted into viscous liquid by laser irradiation. The height of the bonding adhesive is reduced and the width of the bonding adhesive is increased under the effect of the mutual compression of the display substrate and the counter substrate. Finally, the accurately aligned display substrate and counter substrate are firmly bonded together by laser sintering again. Since the outer side of the bonding adhesive is provided with a support structure, and the support structure can shield the outwardly overflowing bonding adhesive, the morphology of the bonding adhesive during the bonding process can be controlled.

The display substrate according to the present disclosure forms support between the mutually assembled display substrate and counter substrate by providing a support structure on the edge area and on a side of the bonding adhesive away from the display area. When the edge cutting is done to the assembled display substrate and counter substrate, the provision of the support structure can prevent the occurrence of cracking on the bonding adhesive during the edge cutting, thereby ensuring the bonding property of the bonding adhesive. Further, the bonding adhesive may be melted into a liquid state in the bonding process. The support structure can effectively control the morphology of the liquid-state bonding adhesive when the bonding adhesive is bonding, so that the liquid-state bonding adhesive will not overflow beyond the support structure, and the height and the homogeneity of the bonding adhesive are kept consistent after being cured, thereby avoiding the occurrence of Newton's ring on the bonding surface between the bonding adhesive and the counter substrate as well as on the film surface of the assembled display substrate and counter substrate in the display area, and finally ensuring the packaging effect of the bonding adhesive and the display effect of the display area.

According to another aspect of the present invention, there is provided a display device, comprising the display substrate according to any one of the foregoing embodiments.

By employing the display substrate of any one of the foregoing embodiments, the packaging effect of the display device is improved, and at the same time, the Newton's ring will not occur on the packaging interface of the display device after packaging, thereby improving the display effect of the display device.

The display panel provided by the present disclosure may be a liquid crystal panel, a liquid crystal television, an OLED panel, an OLED television, a display, a mobile phone, a navigator, and any other product or component having a display function.

In summary, the present disclosure provides a display substrate and a method for manufacturing the same, and a display device. The display substrate includes a display area and an edge area surrounding the display area. The edge area is provided with bonding adhesive. The bonding adhesive is used to bond together the display substrate and the counter substrate to which the display substrate is to be assembled. A support structure is provided on the edge area and on a side of the bonding adhesive away from the display area. The support structure forms support between the mutually assembled display substrate and counter substrate. The present disclosure further provides a display device, which comprises a display substrate according to the present disclosure.

It can be understood that the above embodiments are merely exemplary implementations employed to explain the principles of the present disclosure, but the present disclosure is not limited thereto. Various modifications and improvements can be made by those skilled in the art without departing from the spirit and substance of the disclosure, and such modifications and improvements are also considered to be within the protection scope of the disclosure.

LIST OF REFERENCE SIGNS

1: display area
2: edge area
3: bonding adhesive
4: support structure
L1: gap
L2: spacing
5: cutting line

What is claimed is:

1. A display substrate, comprising
a display area,
an edge area surrounding the display area, a bonding adhesive at the edge area which is configured to bond the display substrate and a counter substrate with which the display substrate is to be assembled, and a support structure on the edge area and on a side of the bonding adhesive away from the display area, wherein the support structure is configured to form support between the display substrate and the counter substrate which have been assembled with each other, wherein a shape of a cross section of the support structure perpendicular to an extending direction of the display substrate on which the support structure is located is a trapezoid, and a bottom surface of the support structure having a larger area is in contact with the display substrate.

2. The display substrate of claim 1, wherein a gap exists between the support structure and the bonding adhesive.

3. The display substrate of claim 2, wherein a width of the gap is substantially equal to 30~50 μm.

4. The display substrate of claim 1, wherein a height of the support structure is less than a height of the bonding adhesive before the display substrate and the counter substrate are bonded.

5. The display substrate of claim 1, wherein the bonding adhesive comprises glass cement.

6. The display substrate of claim 1, wherein the display area is further provided with a spacer.

7. The display substrate of claim 6, wherein a material of the support structure is the same as a material of the spacer.

8. The display substrate of claim 6, wherein a height of the support structure is the same as a height of the spacer.

9. The display substrate of claim 1, wherein a spacing between two adjacent ones of a plurality of the support structures spaced from each other is substantially equal to 5~10 μm.

10. The display substrate of claim 1, wherein the counter substrate is an array substrate.

11. The display substrate of claim 1, wherein the display substrate is a packaging cover plate or a color film substrate.

12. A display device, comprising the display substrate according to claim 1.

13. A method for manufacturing a display substrate which comprises a display area and an edge area, comprising:

coating the edge area with bonding adhesive, providing a support structure on the edge area and on a side of the bonding adhesive away from the display area, wherein a shape of a cross section of the support structure perpendicular to an extending direction of the display substrate on which the support structure is located is a trapezoid, and a bottom surface of the support structure having a larger area is in contact with the display substrate, and sintering the bonding adhesive.

* * * * *